United States Patent [19]

Fietz

[11] Patent Number: 5,226,828
[45] Date of Patent: Jul. 13, 1993

[54] DEVICE FOR UNLOCKING A RESILIENTLY PRESTRESSED CATCH ELEMENT AT THE SIDE OF AN INSERT UNIT

[75] Inventor: Ralf P. Fietz, Paderborn-Elsen, Fed. Rep. of Germany

[73] Assignee: Siemens Aktiengesellschaft, Munich, Fed. Rep. of Germany

[21] Appl. No.: 949,906

[22] Filed: Sep. 23, 1992

[30] Foreign Application Priority Data

Sep. 23, 1991 [DE] Fed. Rep. of Germany ....... 4131661

[51] Int. Cl.$^5$ ............................................. H01R 13/00
[52] U.S. Cl. ................................................... 439/160
[58] Field of Search ................... 439/152–160

[56] References Cited

U.S. PATENT DOCUMENTS

| | | | |
|---|---|---|---|
| 4,243,283 | 1/1981 | McSparran | 439/157 |
| 4,466,680 | 8/1984 | Saki et al. | 439/159 |
| 4,614,389 | 9/1986 | Albert et al. | 439/157 |
| 4,885,436 | 12/1989 | Pham et al. | |
| 4,917,618 | 4/1990 | Behrens et al. | |

FOREIGN PATENT DOCUMENTS

| | | |
|---|---|---|
| 0357308 | 3/1990 | European Pat. Off. . |
| 1282756 | 11/1968 | Fed. Rep. of Germany . |
| 7036498 | 1/1971 | Fed. Rep. of Germany . |
| 8620241.3 | 12/1986 | Fed. Rep. of Germany . |
| 8802800.3 | 7/1988 | Fed. Rep. of Germany . |

*Primary Examiner*—Joseph H. McGlynn
*Attorney, Agent, or Firm*—Hill, Steadman & Simpson

[57] ABSTRACT

A device for unlocking a resilient prestressed catch element which is provided on a side of an insert unit. When the insert unit is inserted into an insert rack, the catch element engages in a catch opening of the insert rack with a sliding motion, as a result of the spring force of the element. A rotatably mounted unlocking lever is arranged on the side of the insert unit and the unlocking lever has a first lever section which will press the catch element out of the catch opening opposite to the spring power as a result of rotation or pivoting of the lever on its mounting. The lever has a second portion or section which will be brought into a position projecting from a front side plane of the insert unit when the unlocking lever is moved from the idle position to the position for disengaging the catch element.

17 Claims, 5 Drawing Sheets

DEVICE FOR UNLOCKING A RESILIENTLY PRESTRESSED CATCH ELEMENT AT THE SIDE OF AN INSERT UNIT

BACKGROUND OF THE INVENTION

The present invention is directed to a device for unlocking a resilient prestressed catch element on a side of an insert unit. When the insert unit is inserted into a card cage or rack, the catch element is engaged by a sliding motion into a catch opening of the card rack as a result of a spring power.

Catch elements for an insert unit enables, first, a stable fastening of the insert unit into the card rack and, second, a rapid replacement of the insert unit by another. A typical application is in the electrical industry when equipping control boxes or cabinets with insert units that accept different electronic devices, for example disk drives or floppy disk drives. When replacing one such device by another, the insert unit is unlocked, then pulled from the cabinet, and the device held by the insert unit is replaced by another. Subsequently, the insert unit is reintroduced into the switch box or cabinet and is locked therein by the catch element.

In a known device, the user must feel the catch element with his finger and unlock it with finger pressure. What is disadvantageous given such a device is that an opening for the finger must be provided between the card rack and the insert unit and that the unlocking requires considerable dexterity on the part of the user. Consequently, a complicated manipulation with the insert unit or an unfavorable utilization of the available space offered overall by the card rack must be accepted.

SUMMARY OF THE INVENTION

It is an object of the present invention to provide an improved device for unlocking a resiliently prestressed catch element which is positioned on an insert unit, which catch element is engaged by the insertion motion of the insert unit into a card rack, with the catch element being received in a catch opening of the rack, which device requires less space and is simple to use.

In the device of the present invention, this object is achieved by an unlocking lever being mounted for rotation on a side of the insert unit, and this unlocking lever will press the catch element out of the catch opening against the spring power with a first portion on the basis of its rotation and will bring in a second portion into position to project from the front side plane of the insert unit to act as a handle for gripping.

The invention is based on the consideration that the space needed for the access of the catch element can be reduced when the catch element is unlocked with the assistance of a mechanical element. The unlocking lever, whose lever sections are designed to simultaneously fulfill different functions, is inventively provided for this purpose. The first lever portion acts to unlock the catch element, whereas the second lever portion projects from the front side plane of the insert unit given the rotational movement and, thus, serves as a grip. After the first lever portion or section has unlocked the catch element, the insert unit can be simply and reliably pulled from the card cage or card rack by this grip. One proceeds in the reverse sequence when inserting the insert unit into the card rack, wherein the user holds the insert unit on the second portion of the unlocking lever, introduces the unit into the card rack until the catch element can engage into the catch opening, and then rotates the unlocking lever back to its initial position. Since the unlocking lever is laterally matched to the insert unit, the space required by it is low so that nearly all the available space in the card rack can be effectively utilized for the insert unit.

In a preferred embodiment of the invention, the rotational movement of the unlocking lever is limited by stops to a range of preferably 90°.

These measures define two extreme positions of the unlocking lever, so that it is possible to bring the unlocking lever into an idle position in the engaged position of the insert unit, wherein it cannot disturb further operation of the insert unit In the other extreme position, a detent serves as a support for the second lever portion in order to obtain a stable mechanical guidance, as well as a beneficial transmission of forces when pulling the insert unit.

In a development of the invention, the first lever portion or section preferably has a ramp-shaped axial cam whose axial stroke is at least equal to the motion stroke of the catch element between a latched position and an unlocked or unlatched position. This axial cam is brought into engagement with the catch element.

Given the pivotable movement or rotary motion of the unlocking lever around its swiveling axis of rotation, the axial cam presses the catch element to disengage it from the catch opening of the card rack against the spring power urging the catch element into the latching condition. The insert unit is released from the card rack as a result thereof and can then be pulled therefrom. When the axial cam has a ramp shape, then the slope would define the stroke of the catch element when turning or rotating the unlocking lever. The overall stroke, as well as the force to be exerted during the rotational movement of the lever, can be defined in a simple way by selecting the slope of the ramp and the rotational angle thereof.

In a development of the above-mentioned improvement, the nose of the catch element resides opposite an initial section of the ramp-shaped axial cam in the inserted condition of the insert unit, wherein the axial cam preferably covers a rotational angle of approximately 45°. As a result thereof, the nose of the spring-loaded catch element presses against the ramp of the axial cam while in the engaged position of the insert unit. The torque produced as a result thereof presses, urges or biases the unlocking lever into its idle position. It is reliably held therein, even when the external forces, for example shaking forces, act on the card rack. The reliability of the insert unit is thereby enhanced.

When 45° is selected as the rotational angle for the effective section of the axial cam, wherein the entire range of the rotation of the unlocking lever is greater than 45°, then the overall pivot movement is divided into two phases. In the first phase, the catch element is shifted to the unlocked or disengaged position, whereas the insert unit is already released from the cage element in the following second phase and can be pulled out during the further course of the rotational movement. This enables a fluid motional transition of the rotational and pulling motions.

Another embodiment of the invention is characterized in that the first lever portion also includes a radial cam that is movable against an abutment connected to the card rack. A linear motion directed in the pulling direction of the insert unit is thereby also effected together with the rotational motion. The lever force created by the radial cam against the abutment enables the insert unit to be pulled with reduced force. This is particularly advantageous when the insert unit in the card carrier is connected to a further device, for example to an electrical connection system, from which it must be released in the first motion section when pulling the insert unit out of the card rack. Via the lever arm of the first lever portion, the radial cam then acts as an auxiliary for overcoming the initial high retaining forces of the contacts. In the above-mentioned exemplary embodiment, thus, the unlocking lever also assumes the function of a pulling tool which will promote the release of the insert unit from the card rack, in addition to assuming its function as an unlocking element and as a grip.

In another advantageous development, a metallic contact spring is provided at the outside of the insert unit. This metallic contact spring resides resiliently in contact with the metallic card rack and is connectible in a conductive fashion to a device held by the insert unit.

An electrically conductive connection is produced between the device and the card rack on the basis of these measures. This electrically conductive connection serves the purpose of dissipating undesirable parasitic currents and establishes a defined potential at the device. The requirements made of the electromagnetic compatibility (EMC) of electrical devices are thereby met in a simple and reliable way.

The afore-mentioned development can be implemented so that the catch element can be clamped between the outside of the insert unit and the spring contact. As a result of this measure, the spring properties of the spring contact are also utilized for the catch element. In addition, assembly parts can be eliminated on the basis of the simple structural solution and the assembly of the insert unit can be simplified.

Another structural simplification occurs when the clamp ribs, onto which the spring contacts can be plugged in a clamping fashion, are provided on an outside of the insert unit. The self-reinforcing clamping of the contact springs upon utilization of the spring properties is thereby achieved.

Another development is characterized in that the insert unit is constructed as a U-shaped plastic clip that can be manufactured by injection molding. As a result of this measure, the insert unit is lent a stable form and can be inserted into the card rack in a simple way on the basis of guides provided on the legs thereof. The device can be accepted between the legs of the plastic clip, whereby it can be adequate to provide the device for unlocking at only one leg. Since the plastic clip can be manufactured with narrow tolerances and in great numbers as a result, the fashioning of the clip as an injection molded part is very advantageous.

A preferred development is characterized in that the insert unit accepts a disk drive or a magnetic tape drive. Such drives produce vibrations due to their electromagnetic drive. Since, in conformity with the invention, the catch element is connected to the card rack, the insert unit is prevented from releasing from the card rack during operation of the drives.

Other advantages and features of the invention will be readily apparent from the following description of the preferred embodiments, the drawings and claims.

BRIEF DESCRIPTION OF THE DRAWINGS

FIGS. 4a-4e are individual parts of the locking mechanism in a plan view, with FIG. 4a being a portion of the plastic clip containing the locking mechanism; FIG. 4d being a plan view of the unlocking lever.

FIGS. 5a, 5b and 5c are partial cross sectional views with portions in elevation showing the locking mechanism in various positions, with FIG. 5a being the insertion of the locking element; FIG. 5b being the element in a locking position, and FIG. 5c being the mechanism in an unlocked and partially removed position;

FIG. 6a is a plan view with portions broken away for purposes of illustration of four locking mechanisms of four separate insert units, with the lever in various angular positions; and FIG. 6b is an end view of one of the locking elements of FIG. 6a.

DESCRIPTION OF THE PREFERRED EMBODIMENTS

Figure 1:
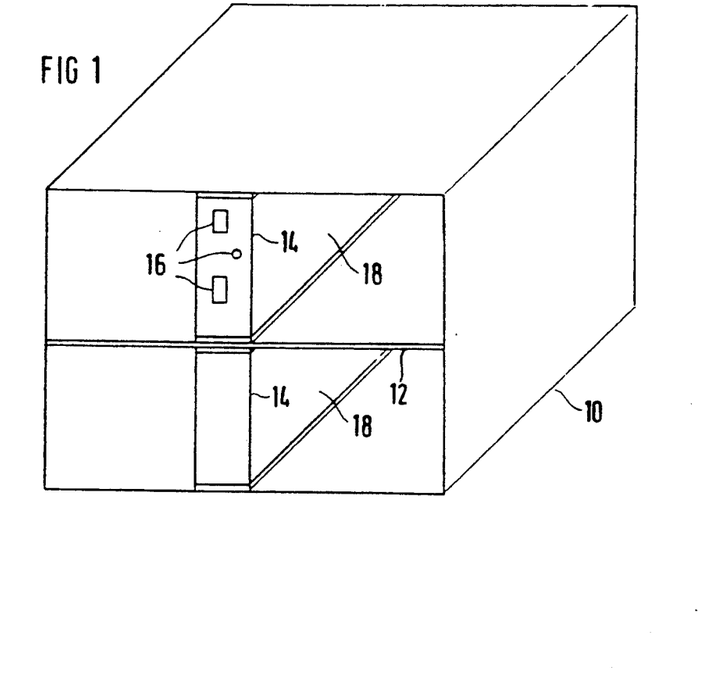
FIG. 1 is a schematic perspective view of a switch box or housing with a plurality of insert units.

The principles of the present invention are particularly useful for releasing a catch element for holding an insert unit 14 in an insert rack 12 of an electrical switch box or housing 10 of a computer. The insert rack 12 serves as a card cage or rack in the switch housing 10. The insert unit 14 accepts electrical devices 18, for example computer periphery devices such as a floppy disk drive or a magnetic disk storage. Control or, respectively, display elements 16 are arranged on a front end of the insert unit 14.

Figure 2:
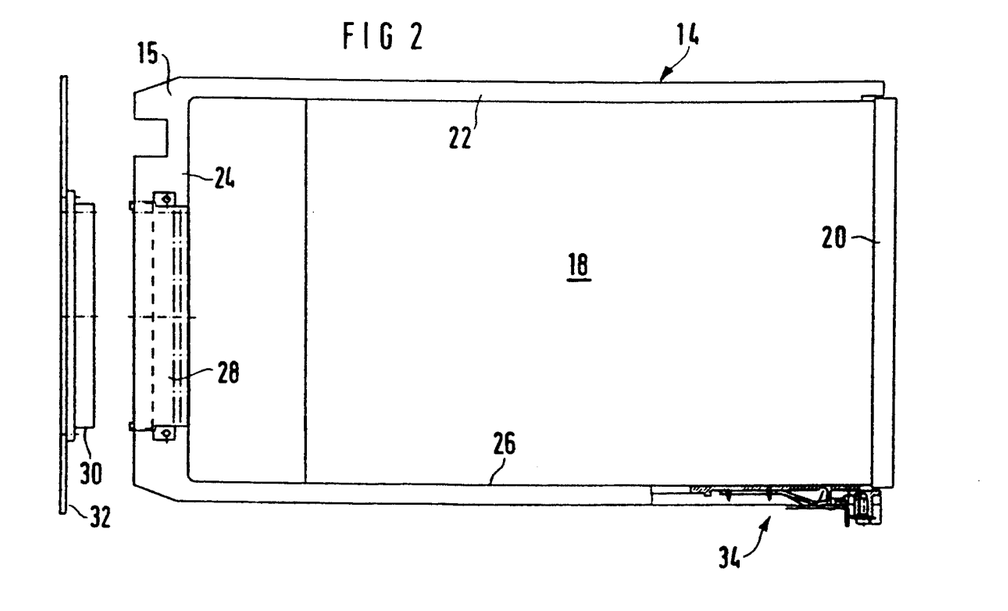
FIG. 2 is a plan view of an insert unit having a plug-connecting system in accordance with the present invention.

The insert unit, as best illustrated in FIG. 2, is composed of a plastic clip 15, which is produced by an injection molding process and has a base 24 with a pair of legs 22 and 26 and has a front wall 20 adjacent the front end of the clip 15. As illustrated, the base 24 of the plastic clip 15 carries an electrical connector plug 28 that can be connected to a corresponding connecting socket 30 that is secured in a rear wall or carrier 32 of the insert rack 12. A locking mechanism, generally indicated at 34, is arranged on a front end or section of the leg 26 and this shall be set forth in greater detail hereinbelow. The locking mechanism 34, as illustrated, is approximately flush with the front wall 20 of the electrical device, which is the plane of the insert unit.

Figure 3:
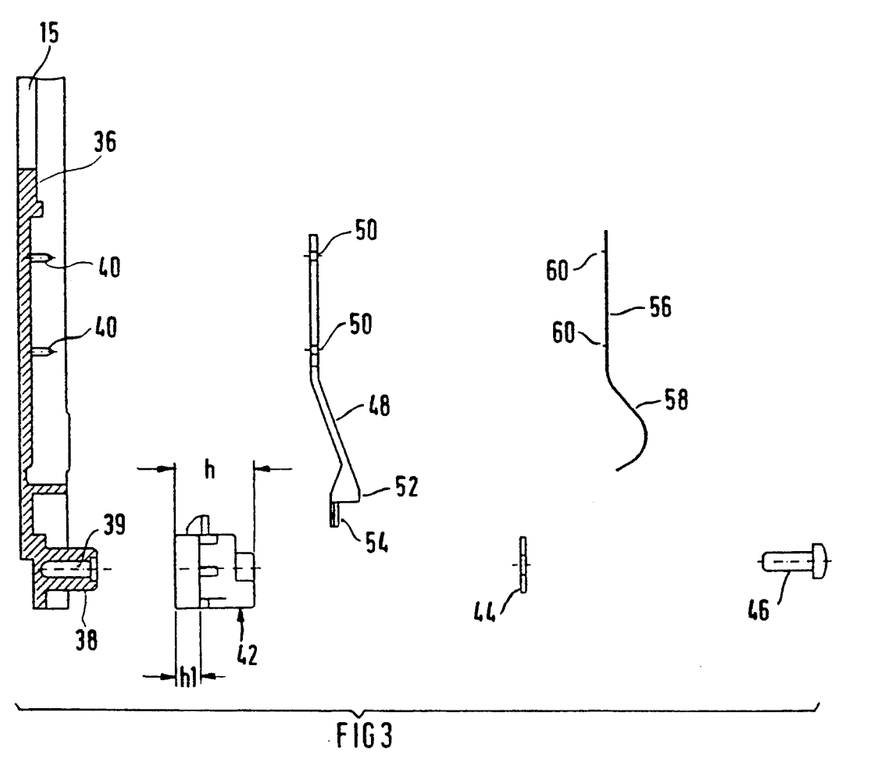
FIG. 3 is an exploded view of the individual components of a locking mechanism in accordance with the present invention.

Various segments of the locking mechanism 34 are illustrated in FIG. 3 in an exploded or disassembled state. A locking element includes a base plate 36 which is integrally connected to the plastic clip 15 and has a male member, such as 38, with a threaded bore 39 in a front end facing toward the front panel 20. An unlocking lever 42 is slipped onto the male member 38 when assembling the locking mechanism 34, and this locking lever 42 will be mounted for rotation on the male member 38 by a washer 44 and a screw 46 which is threaded into the threaded bore 39. A catch element 48, which is made of plastic and comprises a catch 52 from which a nose 54 projects is another component part. A metallic contact spring 56 has a semicircular resilient arced segment 58 on one end facing away from the plastic clip 15. The base plate 36 has four clamp ribs 40, illustrated in FIGS. 3 and 4a. Upon assembly, the catch elements 48 have four corresponding openings 50 (see FIG. 4b) provided at approximate locations, which will be received on the ribs 40. The catch element 48 is fixed in the correct position as a result thereof. Subsequently, clamp slots 60, best illustrated in FIG. 4c, of the contact spring 56, are plugged onto the clamp ribs 40 and the contact spring 56 is clamped to the base plate 36 by pressing the contact spring 56 against the base plate 36.

The spring property of the contact spring 56 causes the clamp slots 60, whose respective openings are slightly smaller than the width of the corresponding clamp ribs 40, to slide over the clamp ribs 40 under spring pressure when being pressed on in a plug-on direction. Thus, the edges of the openings are slightly bent in the opposite direction. When the contact spring 56 is moved opposite the plug-on direction, the bent-over edges will engage or dig into the elastic material of the corresponding clamp ribs 40 with its edges and deform it. Continued motion opposite the plug-on direction is, thus, prevented. The spring power occurs due to the deformation of the edge prestresses the contact spring 56 in the plug-on direction so that it is resiliently held against the base plate 36 after being plugged on. Additional fastening means are, thus, not required in this type of fastening.

The catch element 48 is resiliently clamped when the contact spring 56 is plugged on. The elasticity of the contact spring 56 can co-enhance the spring action of the catch 52. The catch element 48 and the contact spring 56 can thereby function independently of one another.

Figures 4A, 4D:
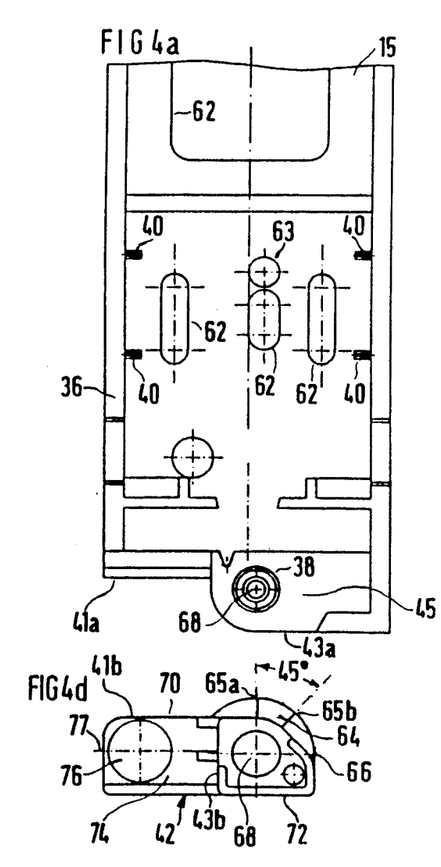
Figure 4B:
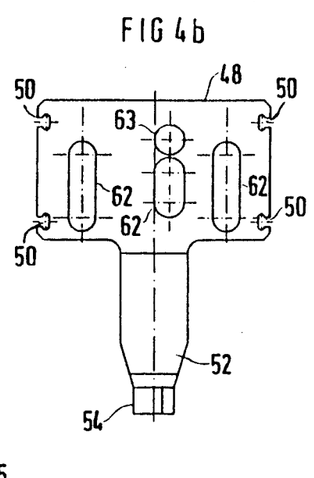
FIG. 4b being a plan view of the plastic catch element.
Figure 4C:
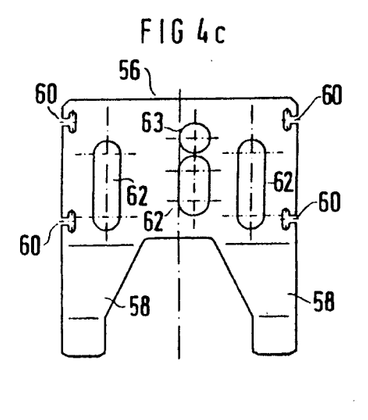
FIG. 4c being a plan view of a metal contact spring.

FIG. 4a is a partial plan view of the outside of the plastic clip 15, which has the locking mechanism 34, wherein the individual components are shown in their unassembled condition in FIGS. 4a–4d. The base plate 36 has a seat surface 45 on which the unlocking lever 42 can lie. It also contains a clearances or apertures 62 that serve the purpose of accepting or, respectively, fastening the electrical device 18. Some of these apertures are also shown in FIGS. 4b and 4c for both the catch element 48 and the contact spring 56. The components 36, 48 and 56 each, respectively, have a bore hole 63 through which the electrical device 18 can be conductively connected to the contact spring 56 with a screw.

Figure 4E:
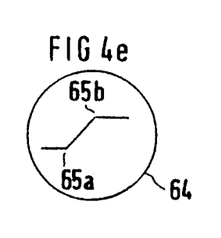
FIG. 4e being the profile of an axial cam of the lever.

With respect to the axis of rotation 68 on the projection 38, the unlocking lever 42 is divided into a first lever section 72 and into a second lever section or portion 70. The second lever section 70 serves as a grip 74 and has a gripping depression, such as 76, so that the grip 74 can be firmly seized between the finger and thumb of the user. The first lever section or portion 72 has a ramp-shaped axial first cam 64 having an initial section 65a and a final section 65b. The axial first cam 64 shape is shown schematically enlarged in FIG. 4e and this shape will cover an angle of rotation of approximately 45°. The section 65 of the cam 64, which causes a stroke of the catch element 52, begins at 90° with respect to the longitudinal axis 77 of the unlocking lever 42. This first lever section 72 is provided also with a radial second cam 66, whose radial cam begins approximately at a level of the final section 65b. The radial second cam 66 achieves its maximum stroke at an angle of approximately 180° relative to the longitudinal axis 77 of the unlocking lever 72.

Figures 6A, 6B:
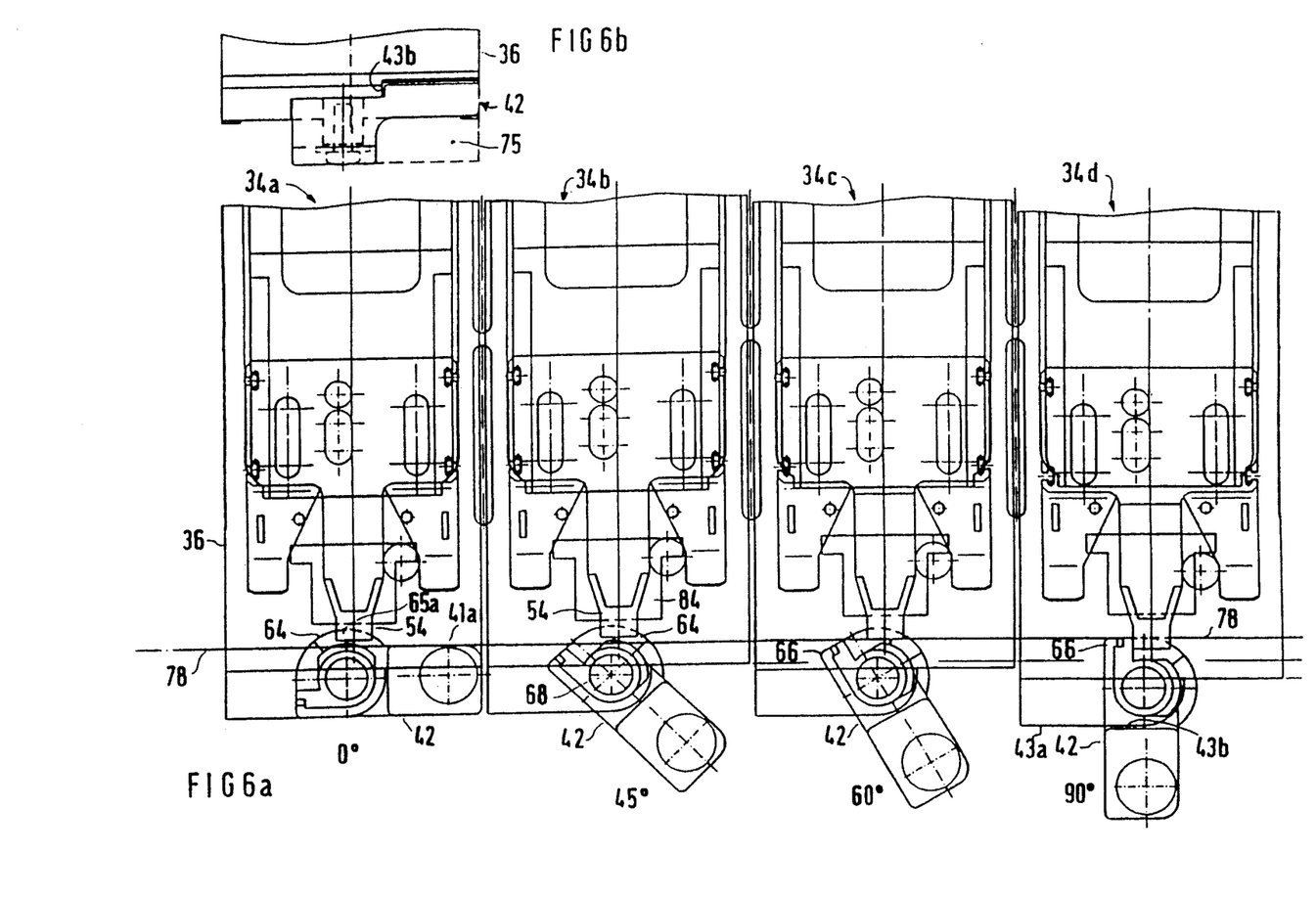

When the unlocking lever 42 is inserted onto the male projection or member 38 and has the same relationship as illustrated in FIGS. 4a and 4d, it will assume an idle position. In this position, its edge 41b strikes against an edge 41a of the base plate 36. The unlocking lever 42 can be pivoted by 90° in a counter-clockwise direction from this idle position and is then situated in a pull-out position. In this pull-out position, a stop edge 43b is provided on an underside of the unlocking lever 42 and, as best illustrated in FIGS. 6a and 6b, the stop edge 43b will strike against an edge 43a of the base plate 36 and, thus, limit the rotational movement.

Figures 5A, 5B:
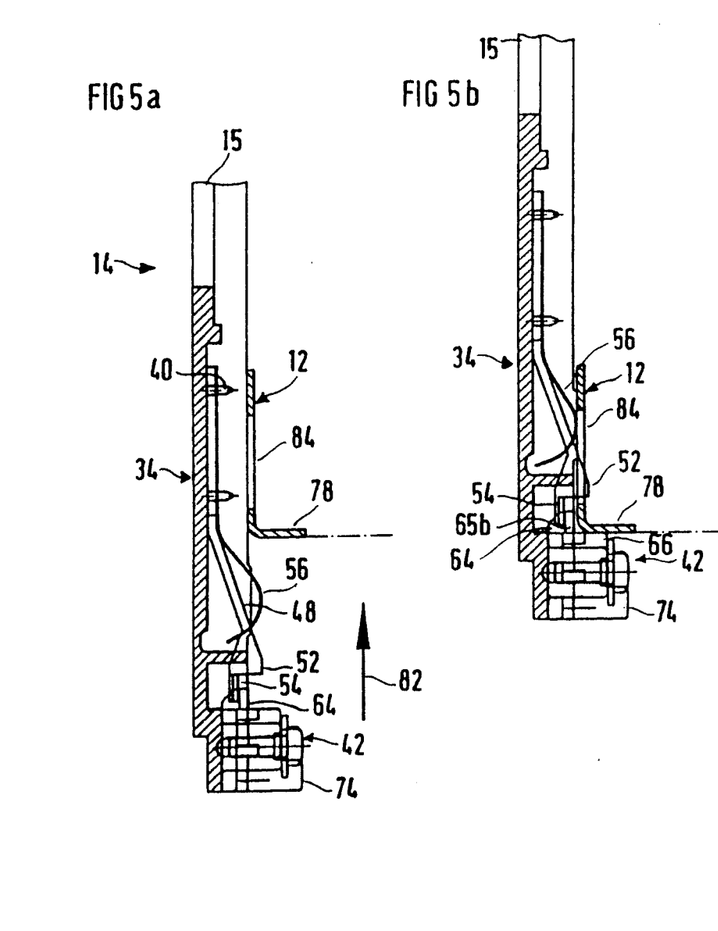
Figure 5C:
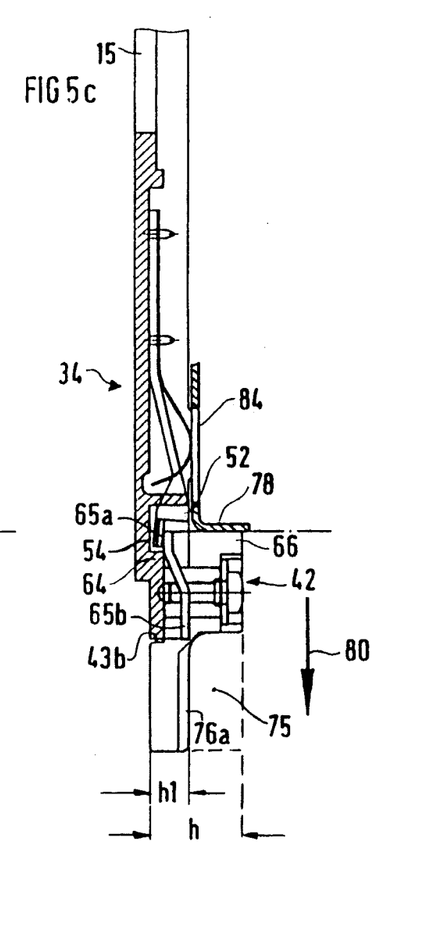

The locking mechanism 34, together with the front section of the insert rack 12, are shown in three positions in FIGS. 5a–5c. In the position of FIG. 5a, the insert unit 14 has been pulled from the insert rack 12 by a given distance. The catch 52 is then released from a part of the insert rack 12 which has a catch opening 84 and an abutment 78 formed by a leading edge of the rack 12. When the insert unit 14 is inserted into the insert rack 12 in the direction of the arrow 82, then the catch 52 engages into the catch opening 84 and locks the insert unit 14 to the insert rack 12. This is shown by the position of FIG. 5b, wherein the contact spring 56 presses against the insert rack 12 and, thus, creates an electrical contact.

For pulling the insert unit 14 out of the insert rack 12, the unlocking lever 42 is grasped at the grip 74 by a user and is pivoted or rotated through 90° to the position of FIG. 5c. Given this rotational motion, the axial first cam 64 has its ramp-shaped section engaging the nose 54 of the catch element 48 and, thus, moves the catch element from the engaging position in the catch opening 84 to a retracted position. During further motion, the radial second cam 66 is pressed against the abutment 78 so that the insert unit 14 is moved or shifted out of the insert rack 12 in the direction of the arrow 80 to disconnect the plug mechanisms 28 and 30.

It may be seen in that position of the unlocking lever 42, which is completely pivoted out, that the grip 74 is fashioned flat and has a gripping web 76a on its upper side. For pivoting the grip 74 out, this is grasped by the user in the idle position of the unlocking lever 42. The height h1 of the grip 74 is substantially less than the overall height h of the unlocking lever 42. In the idle position of the unlocking lever 42 (see FIG. 5b), thus, a space is formed between the insert rack 12 and the insert unit 14, which is indicated by reference numeral 75 in FIGS. 5c and 6b. An inwardly disposed door hinge of a door held by the insert rack 12 can project into this space 75. When opening the door, the door hinge opens up the space 75, so that an engagement opening for the finger and thumb of the user toward the gripping web 76a is created, and the space in the insert rack 12 is optimally utilized as a result of this structural measure.

In FIG. 6a, four unlocking mechanisms 34a–34d are shown in line with four different pivot positions for the unlocking lever 42 having rotational angles from 0° to 90°. At the rotational angle of 0°, the unlocking lever 42, as illustrated by the mechanism 34a, is in the idle position. In this position, the nose 54 of the catch element 48 resides under spring power and presses against the initial section 65a of the ramp-shaped axial first cam 64. As a result thereof, a torque is exerted on the unlocking lever 42, and this torque will press or bias the lever lightly against the edge 41a of the base plate 36. Even if the unlocking lever 42 were to assume a rotational angle of greater than 0° vis-a-vis the front edge of the base plate 36 in the idle position, which can occur, for example, given a careless insertion of the insert unit 42 into the insert rack 12, the torque generated by the nose 54 on the first cam 64 would bias and move the unlocking lever 42 into its idle position. The unlocking lever is, thus, assisted in assuming its idle position and thereby assures that the unlocking lever 42 cannot represent a disturbing factor or be damaged when the cabinet door is closed. The space 75, which is formed by the reduced height of the grip 74, can be seen in FIG. 6b.

The ramp-shaped axial first cam 64 has its greatest stroke given a rotational angle of 45° (see lever 42 for mechanism 34b), and this stroke is adequate in order to move the catch 52 out of the catch opening 48. In this position, the radial cam 66 still does not quite press against the abutment 78. In the third arrangement 34c from the left, the rotational angle of 60° has been applied to the lever 42 and the radial second cam 66 is in engagement with the abutment 78 and has already shifted the insert unit 14 out of the insert rack 12 by a slight distance. Given a complete rotational angle of 90°, as shown by the right-hand side mechanism 34d, the radial second cam 66 has reached its maximum radial stroke. In this position, the contacts of the plug-type connector 28 of the insert unit 14 have been pulled from the plug socket 30 through the contacting distance, for example 5 mm to 10 mm. As a result of the lever action of the radial second cam 66, the initially high contact forces of the plug-type connectors 28, 30 can be easily overcome so that a pulling motion will occur without any jerks.

Although various minor modifications may be suggested by those versed in the art, it should be understood that I wish to embody within the scope of the patent granted hereon all such modifications as reasonably and properly come within the scope of my contribution to the art.

I claim:

1. In a device for unlocking a resiliently prestressed catch element provided on the side of an insert unit, said catch element being engaged in a catch opening of a card rack as a result of the spring force of the element when the insert unit is inserted into the card rack, the improvements comprising an unlocking lever being mounted for rotation on a side of the insert unit, said unlocking lever having a first lever portion pressing the catch element and shifting it from engagement in the catch opening against the spring power as a result of a rotational movement of the lever, said lever having a second portion which will be brought into a position projecting from a front side plane of the insert unit as the lever is rotated through an angle of approximately 90°.

2. In a device according to claim 1, wherein the rotational movement of the unlocking lever can be limited to a pivot range of 90° by detents.

3. In a device according to claim 1, wherein the unlocking lever is arranged on an outside of an insert unit and terminates approximately flush with the front side plane in the inserted condition of the insert unit.

4. In a device according to claim 1, wherein the second portion of the lever has a trough-shaped depression for providing a gripping surface.

5. In a device according to claim 1, wherein the insert unit has receptacle elements for a device in the form of circles and slot-shaped apertures.

6. In a device according to claim 1, wherein the second portion of the lever has a diminished height in comparison to the overall height of the unlocking lever.

7. In a device according to claim 1, wherein the insert unit accepts a drive selected from disk drives and magnetic tape drives.

8. In a device according to claim 1, wherein the first lever portion has a first axial cam, whose axial stroke is at least equal to the motion stroke required for moving the catch element between a latching position and an unlatching position, said first cam being in engagement with the catch element.

9. In a device according to claim 8, wherein a nose of the catch element resides opposite the initial section of the axial first cam and in the inserted condition of the insert unit, in that the effective section of the axial first cam covers a rotational angle of approximately 45° and engages said nose.

10. In a device according to claim 9, wherein the first lever portion also has a radial second cam which is movable against an abutment connected to the card rack.

11. In a device according to claim 10, wherein the insert unit is an electronic insert unit and, in its inserted condition, is connected to the card rack via a plug-type connector system that can be separated in the direction of the pull-out motion of the insert unit, said radial second cam having a cam stroke that provides a predetermined ratio to the contact distance of the plug-type connector system so that actuation of the radial second cam will cause a predetermined amount of disconnection of the plug-type connector.

12. In a device according to claim 11, wherein the stroke of the radial second cam is identical to the contact distance so that actuation of the second cam causes a disconnection of the plug-type connector system.

13. In a device according to claim 1, which includes a metallic contact spring being provided on the outside of the insert unit, said metallic contact spring being resiliently in contact with a metal card rack and being conductively connected to a device held by the insert unit.

14. In a device according to claim 13, wherein the catch element is clamped between the outside of the insert unit and the contact spring.

15. In a device according to claim 14, wherein the insert unit has clamp ribs and the contact spring is inserted onto the clamped ribs in a clamping fashion.

16. In a device according to claim 1, wherein the insert unit is constructed as a U-shaped plastic clip, said plastic clip being injection molded.

17. In a device according to claim 16, wherein the plastic clip carries a connector element on a base, said connector element being connectible to a connector element on the card rack, said catch element being provided on at least one leg of the plastic clip distally from the base thereof.

* * * * *

UNITED STATES PATENT AND TRADEMARK OFFICE
CERTIFICATE OF CORRECTION

PATENT NO. : 5,226,828
DATED : July 13, 1993
INVENTOR(S) : Ralf P. Fietz It is certified that error appears in the above-identified patent and that said Letters Patent is hereby corrected as shown below:

Title page, item [73] Assignee "Siemens Aktiengesellschaft, Munich," has been changed to read --Siemens Nixdorf Informationssysteme AG, Paderborn,--

Signed and Sealed this

Ninth Day of August, 1994

Attest:

BRUCE LEHMAN

Attesting Officer     Commissioner of Patents and Trademarks